(12) United States Patent
Yokoyama et al.

(10) Patent No.: US 10,263,531 B2
(45) Date of Patent: Apr. 16, 2019

(54) METHOD FOR MANUFACTURING RECTIFIER AND RECTIFIER

(71) Applicant: Mitsubishi Electric Corporation, Tokyo (JP)

(72) Inventors: Tadashi Yokoyama, Tokyo (JP); Atsuya Iwamoto, Tokyo (JP); Seisaku Imagawa, Tokyo (JP); Toshiyuki Oonishi, Tokyo (JP); Yuzuru Kobayashi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 16/046,535

(22) Filed: Jul. 26, 2018

(65) Prior Publication Data

US 2019/0036460 A1    Jan. 31, 2019

Related U.S. Application Data

(62) Division of application No. 14/411,597, filed as application No. PCT/JP2012/080593 on Nov. 27, 2012, now Pat. No. 10,069,432.

(51) Int. Cl.
*H02K 11/00* (2016.01)
*H02M 7/00* (2006.01)
(Continued)

(52) U.S. Cl.
CPC ........ *H02M 7/003* (2013.01); *H01L 21/4882* (2013.01); *H01L 23/36* (2013.01);
(Continued)

(58) Field of Classification Search
CPC ........ H02K 11/05; H02K 11/046; H01L 23/36
(Continued)

(56) References Cited

U.S. PATENT DOCUMENTS

| 4,118,134 A | 10/1978 | Mansel |
| 5,716,156 A | 2/1998 | Bayer et al. |

(Continued)

FOREIGN PATENT DOCUMENTS

| DE | 10 2006 019 315 A1 | 10/2007 |
| JP | 10-242671 A | 9/1998 |

(Continued)

OTHER PUBLICATIONS

International Search Report of PCT/JP2012/080593, dated Feb. 19, 2013. [PCT/ISA/210].

(Continued)

*Primary Examiner* — Hanh N Nguyen
(74) *Attorney, Agent, or Firm* — Sughrue Mion, PLLC; Richard C. Turner

(57) ABSTRACT

A heat dissipation heat sink having a press-fit hole whose inner peripheral surface is a cast skin surface is included; the heat dissipation heat sink is sandwiched by the press-fit head and the insertion guide by aligning the axis of a rectifying element in an insertion guide with the axis of the press-fit hole and making the press-fit head face the heat dissipation heat sink; a protrusion portion of a load receiving jig is made to face the rectifying element in the insertion guide; and the rectifying element is press-fitted into the press-fit hole of the heat dissipation heat sink by pressing the periphery of the press-fit hole of the heat dissipation heat sink (22,23) by the press-fit head and receiving a load applied to the rectifying element by the protrusion portion of the load receiving jig.

10 Claims, 10 Drawing Sheets

(51) Int. Cl.
　　　H02K 11/05　　　(2016.01)
　　　H01L 23/00　　　(2006.01)
　　　H01L 23/36　　　(2006.01)
　　　H02K 11/04　　　(2016.01)
　　　H01L 25/11　　　(2006.01)
　　　H01L 21/48　　　(2006.01)
　　　H02M 7/04　　　(2006.01)
　　　H01L 23/40　　　(2006.01)

(52) U.S. Cl.
　　　CPC .......... *H01L 23/4093* (2013.01); *H01L 24/01* (2013.01); *H01L 25/115* (2013.01); *H02K 11/046* (2013.01); *H02K 11/05* (2016.01); *H02M 7/04* (2013.01); *Y10T 29/49117* (2015.01)

(58) Field of Classification Search
　　　USPC ................... 310/68 D; 363/141, 155; 29/596
　　　See application file for complete search history.

(56) References Cited

U.S. PATENT DOCUMENTS

| | | | |
|---|---|---|---|
| 5,828,564 | A | 10/1998 | Mori et al. |
| 6,476,527 | B2 | 11/2002 | Ballard et al. |
| 6,642,078 | B2 | 11/2003 | Roozrokh et al. |
| 7,282,824 | B2 | 10/2007 | Fujioka |
| 7,855,480 | B2 | 12/2010 | Ito et al. |
| 10,069,432 | B2 * | 9/2018 | Yokoyama .............. H01L 23/36 |
| 2002/0047357 | A1 | 4/2002 | Gautier |
| 2002/0047358 | A1 * | 4/2002 | Asao ...................... H02K 5/225 310/68 D |
| 2002/0113510 | A1 * | 8/2002 | Morikaku .............. H02K 5/225 310/91 |
| 2004/0150273 | A1 | 8/2004 | Fujioka |
| 2005/0097721 | A1 | 5/2005 | Bratek et al. |
| 2008/0054766 | A1 | 3/2008 | Kondo |
| 2009/0059635 | A1 | 3/2009 | Ito et al. |

FOREIGN PATENT DOCUMENTS

| | | | |
|---|---|---|---|
| JP | 2002-119028 | A | 4/2002 |
| JP | 2002-261215 | A | 9/2002 |
| JP | 2004-098261 | A | 4/2004 |
| JP | 2004-195567 | A | 7/2004 |
| JP | 3675767 | B2 | 7/2005 |
| JP | 4122907 | B2 | 7/2008 |
| JP | 2009-077617 | A | 4/2009 |
| JP | 2010-166764 | A | 7/2010 |
| JP | 2011-15513 | A | 1/2011 |
| JP | 4626665 | B2 | 2/2011 |

OTHER PUBLICATIONS

Communication dated Oct. 8, 2016 from the State Intellectual Property Office of the P.R.C. in counterpart Application No. 201280077181.7.

Communication dated May 16, 2017 issued by the State Intellectual Property Office of People's Republic of China in counterpart Application No. 201280077181.7.

Communication dated Jul. 14, 2016, from the European Patent Office in counterpart European application No. 12889352.6.

Communication dated Jul. 7, 2015 from the Japanese Patent Office in counterpart application No. 2014549662.

Communication dated Oct. 25, 2018 issued by the Intellectual Property Office of India in counterpart Application No. 2712/CHENP/2015.

* cited by examiner

METHOD FOR MANUFACTURING RECTIFIER AND RECTIFIER

CROSS REFERENCE TO RELATED APPLICATIONS

This application is a divisional of U.S. application Ser. No. 14/411,597 filed Dec. 29, 2014, which is a National Stage of International Application No. PCT/JP2012/080593 filed Nov. 27, 2012, the contents of all of which are incorporated herein by reference in their entirety.

TECHNICAL FIELD

The present invention relates to a method for manufacturing a rectifier and a rectifier including a rectifying element that is press-fitted and held to a heat dissipation heat sink and, more particularly, relates to a method for press-fitting to the heat dissipation heat sink of the rectifying element and is preferably adopted to a vehicle alternating current generator equipped in a vehicle or the like.

BACKGROUND ART

In conventional rectifiers and, more particularly, in a rectifier that is always subjected to vibration during equipped in a vehicle, the outer diameter of a columnar heat sink of a rectifying element is made larger than the inner diameter of a press-fit hole formed in a heat dissipation heat sink and a press-fit allowance is set so as not to drop the rectifying element from the heat dissipation heat sink after being press-fitted and attached. In this case, a high load is applied to the bottom outer surface, which serves as a pressing surface, of the columnar heat sink of the rectifying element; and accordingly, a problem exists in that a semiconductor pellet equipped on the bottom inner surface of the columnar heat sink deforms.

The following is included in conceivable techniques as countermeasures against the aforementioned problem.
1. A configuration is made such that the inner diameter of a press-fit hole is decreased gradually in a press-fit direction (from one side to the other side), a (cylindrical or columnar) heat sink of a diode is made to deform obliquely (conically) along the inner peripheral surface of the press-fit hole (Patent Document 1, FIG. 3), and press-fit is performed by uniformly applying a load to a pressing surface by a press-fit rod whose end surface is flat. Alternatively, the end surface of a press-fit jig is formed into a spherical concave surface and is mainly brought into contact with an outer peripheral portion of the pressing surface to suppress deformation of a rectifying element.
2. Taper of a press-fit hole on the receiving side of a diode is set to 0.2 to 2.5 degrees, preferably 0.3 to 2 degrees; and thus, the diode is bonded without exceeding a maximum allowable press-fit force (Patent Document 2, FIG. 2). Knurling on the outer periphery of the diode deforms at a significantly large depth on the small diameter side of the press-fit hole on the receiving side of the diode. A press-fit process is controlled by taking into account the degree of offset and pressing force.
3. The inner peripheral surface of a press-fit hole of a heat dissipation fin is formed in a tapered shape; and the inner diameter on the press-fit start side is made larger than the inner diameter on the opposite press-fit start side (Patent Document 3, FIG. 5). Alternatively, a configuration is made such that the inner diameter of the press-fit hole of the heat dissipation fin is constant and the outer diameter of the outer peripheral surface on the driving start side of a rectifying element is smaller than that on the opposite driving side, the outer peripheral surface being formed with knurling (Patent Document 3, FIG. 3). This prevents a deterioration in heat dissipation property caused by a reduction in contact area due to galling or the like on the press-fit start side and a deterioration in the life of thermal fatigue of the element. In FIG. 3 of Patent Document 3, concurrently with the beforementioned, the opposite driving side is made lower than the driving start side in the radial height of a large diameter convex portion of the knurling shape, and the large diameter convex portion is well-fitted and driven to the heat dissipation fin while being further deformed in driving (start).
4. A configuration is made such that a receiving hole is formed in an aluminum plate member with approximately a thickness of 6 mm by a punching die, and a diode is press-fitted. A contact range between the diode and the aluminum plate member is relatively small (Patent Document 4, FIG. 6). The punched member can be recycled in normal circumstances.

On the other hand, Patent Document 5 discloses a technique in which a member to be press-fitted and a press-fit member are held in sandwiched relation by an upper pressing portion and a lower pressing portion; and the lower pressing portion is brought into contact with the press-fit member from the lower side and is made to move upward to press-fit the press-fit member into the member to be press-fitted. A configuration is made such that, in order to improve the positioning accuracy of the member to be press-fitted, a centering pin whose outer peripheral surface is formed in a tapered shape is provided on the upper pressing portion and the centering pin is made to engage with a press-fit hole of the member to be press-fitted.

PRIOR ART DOCUMENT

Patent Document

Patent Document 1: Japanese Examined Patent Publication No. 3675767 (FIG. 3)
Patent Document 2: German Patent Invention No. DE 10 2006 019 315A1 Specification (FIG. 2)
Patent Document 3: Japanese Examined Patent Publication No. 4626665 (FIG. 3, FIG. 5)
Patent Document 4: U.S. Pat. No. 6,476,527B2 Specification (FIG. 6)
Patent Document 5: Japanese Examined Patent Publication No. 4122907

SUMMARY OF THE INVENTION

Problems to be Solved by the Invention

As for the conventional press-fit hole in a large number of examples, a desired shape is obtained by cutting an inner peripheral edge portion thereof. It is because of the necessity for retaining the rectifying element so as to be sustainable against vibration applied thereto and the necessity of positional accuracy for subsequent electrical connection. In cutting, material to be cut and removed is useless and a manufacturing process is also increased. For example, as the cutting process of the inner peripheral edge portion of the press-fit hole, four processes are conceivable: (a) cutting by a cutter, (b) removal treatment of chip, (c) treatment (cleaning) of cutting liquid, and (d) confirmation. More particularly, a large number of man-hours is required in models in which twelve rectifying elements combining positive pole side and negative pole side per one generator are used. Furthermore, the cutting liquid cannot be easily discarded, different energy for the treatment is needed, and it becomes adverse to global environmental protection such as a recent reduction in $CO_2$ emissions.

It is basically the same even when a desired taper is formed in the press-fit direction of the press-fit hole shown in the aforementioned Patent Documents 1 to 3. It is conceivable that cutting is applied to the inner peripheral edge portion of the press-fit hole after forming the heat sink to obtain a stable tapered surface and the retention and the positional accuracy of the rectifying element can be secured. In the case of including the tapered shape on the knurling side of the rectifying element shown in FIG. 3 of Patent Document 3, there is conceivable a problem in which tapering formation of the rectifying element (diode) that is a common component ordinarily obtained from a manufacturing maker is not easy from its manufacturing technique; individual specification and individual manufacturing method are specified; and it lacks versatility and manufacture costs cannot be reduced as components of a generator, which are mass-produced items.

Furthermore, in the hole configuration by the punching die shown in Patent Document 4, a hole section is, for example, a convex shape at only a central portion as shown in FIG. 6; droop or the like is essentially made; and a range unsuitable for retention and/or contact is inevitably generated. Only a part of a base of the diode comes in contact with the hole; and accordingly, heat dissipation efficiency is low and it cannot correspond to the recent flow of higher efficiency and higher output. Besides, when a complicated shape, for example, a large number of fins that improve cooling property of a generator, is attempted to be obtained by the punching die, the respective fins cannot help but be punched by different dies and productivity is extremely inferior; and accordingly, it is hard to be adopted.

In view of the aforementioned problems, the present invention is to provide a method for manufacturing a rectifier and a rectifier, which reduce the number of cutting processes and costs. Furthermore, the present invention is to provide a reliable method for manufacturing a rectifier which does not apply an excessive load to a semiconductor pellet of a rectifying element.

Means for Solving the Problems

According to the present invention, there is provided a method for manufacturing a rectifier in which a rectifying element, which has a columnar heat sink and is equipped with a semiconductor pellet that converts alternating current to direct current, is press-fitted into a press-fit hole of a heat dissipation heat sink by aligning the axis of the rectifying element with the axis of the press-fit hole, the method including: the heat dissipation heat sink which has the press-fit hole whose inner peripheral surface is a cast skin surface; a press-fit head which applies a load to the heat dissipation heat sink; an insertion guide which has a through hole, retains the rectifying element by the through hole, and guides the rectifying element so as to align the axis of the rectifying element with the axis of the press-fit hole of the facing heat dissipation heat sink; and a load receiving jig which is formed with a protrusion portion at one end portion thereof. The method includes the steps of: sandwiching the heat dissipation heat sink by the press-fit head and the insertion guide by aligning the axis of the rectifying element in the insertion guide with the axis of the press-fit hole of the heat dissipation heat sink and making the press-fit head face the heat dissipation heat sink; making the protrusion portion of the load receiving jig face the columnar heat sink of the rectifying element in the through hole of the insertion guide; and press-fitting the rectifying element into the press-fit hole of the heat dissipation heat sink by pressing the periphery of the press-fit hole of the heat dissipation heat sink by the press-fit head and receiving a load applied to the columnar heat sink of the rectifying element by the protrusion portion of the load receiving jig.

Furthermore, according to the present invention, there is provided a method for manufacturing a rectifier, in which the load receiving jig has an annular receiving surface with a concave portion at a central portion at an end portion of the protrusion portion thereof and receives a load applied to an outer peripheral edge portion of the columnar heat sink of the rectifying element by the annular receiving surface.

Besides, according to the present invention, there is provided a rectifier in which a rectifying element, which has a columnar heat sink, has a lead at one end portion thereof, and is equipped with a semiconductor pellet that converts alternating current to direct current, is press-fitted into a press-fit hole of a heat dissipation heat sink by aligning the axis of the rectifying element with the axis of the press-fit hole. In the rectifier, the inner peripheral surface of the press-fit hole of the heat dissipation heat sink is a cast skin surface; and an outer peripheral portion of the columnar heat sink of the rectifying element is formed with a knurl, and the height of the ridge from the valley of the knurl is equal to or more than ½ of a hole diameter tolerance of the press-fit hole of the heat dissipation heat sink.

Advantageous Effect of the Invention

The method for manufacturing the rectifier according to the present invention includes the heat dissipation heat sink which has the press-fit hole whose inner peripheral surface is the cast skin surface. In the method, the heat dissipation heat sink is sandwiched by the press-fit head and the insertion guide by making the press-fit head face the heat dissipation heat sink; the protrusion portion of the load receiving jig is made to face the columnar heat sink of the rectifying element in the through hole of the insertion guide; and the rectifying element is press-fitted into the press-fit hole of the heat dissipation heat sink by pressing the periphery of the press-fit hole of the heat dissipation heat sink by the press-fit head and receiving the load applied to the columnar heat sink of the rectifying element by the protrusion portion of the load receiving jig, whereby the number of cutting processes and costs can be reduced.

Furthermore, in the method for manufacturing the rectifier according to the present invention, the load receiving jig has the annular receiving surface with the concave portion at the central portion at the end portion of the protrusion portion thereof and receives the load applied to the outer peripheral edge portion of the columnar heat sink of the rectifying element by the annular receiving surface, whereby there can be obtained a method for manufacturing a rectifier which does not apply an excessive load to a semiconductor pellet of the rectifying element and has reliability.

Besides, in the rectifier according to the present invention, the inner peripheral surface of the press-fit hole of the heat dissipation heat sink is the cast skin surface; and the outer peripheral portion of the columnar heat sink of the rectifying element is formed with the knurl, the height of the ridge from the valley of the knurl is equal to or more than ½ of the hole diameter tolerance of the press-fit hole of the heat dissipation heat sink, whereby there can be obtained a rectifier with high reliability, in which the columnar heat sink can be stably retained in the press-fit hole formed of the cast skin surface and a contact area can also be stably obtained. Then, the rectifier is reduced in the number of cutting processes and costs.

Objects, features, aspects, and advantageous effects other than the before mention of the present invention will become more apparent from the following detailed description of the present invention which refers to the accompanying drawings.

MODE FOR CARRYING OUT THE INVENTION

Embodiment 1

Figure 1:
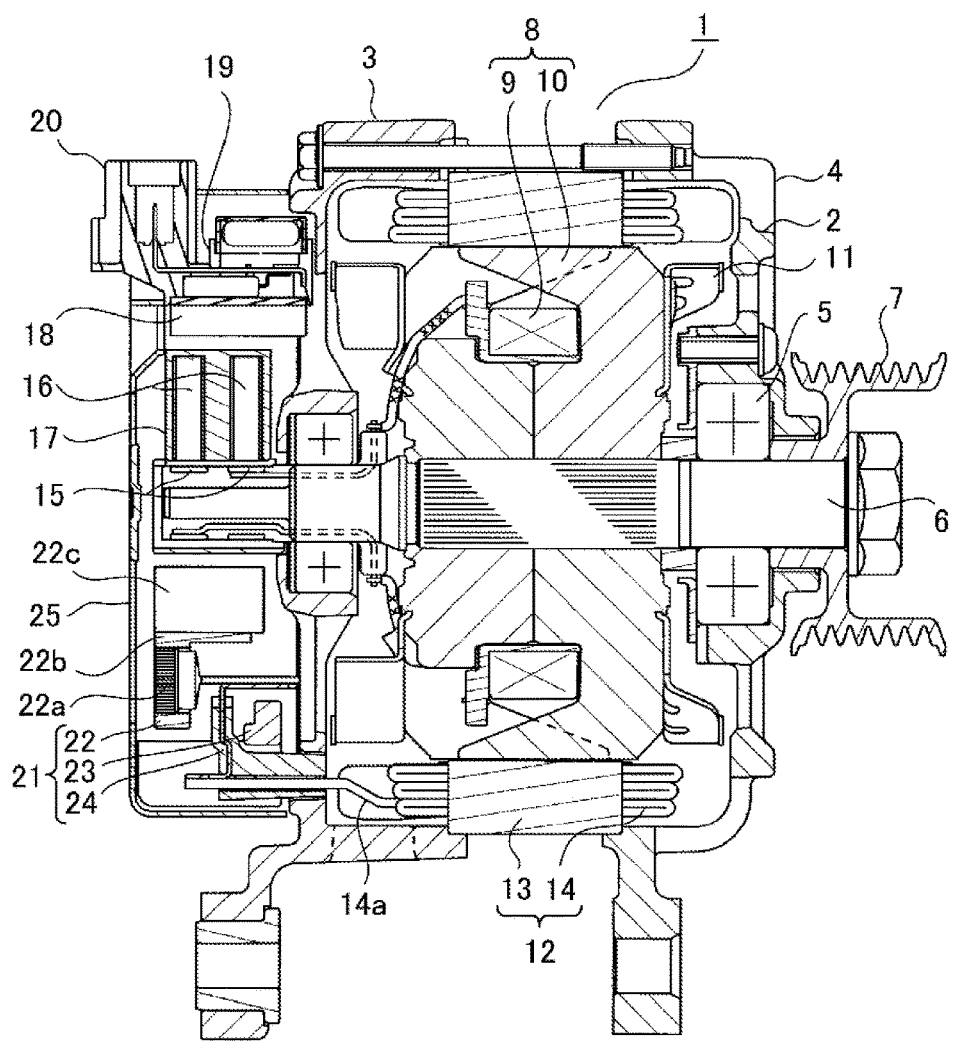
FIG. 1 is a sectional view showing a vehicle alternating current generator to which a rectifier according to Embodiment 1 of the present invention is applied.
Figure 2:
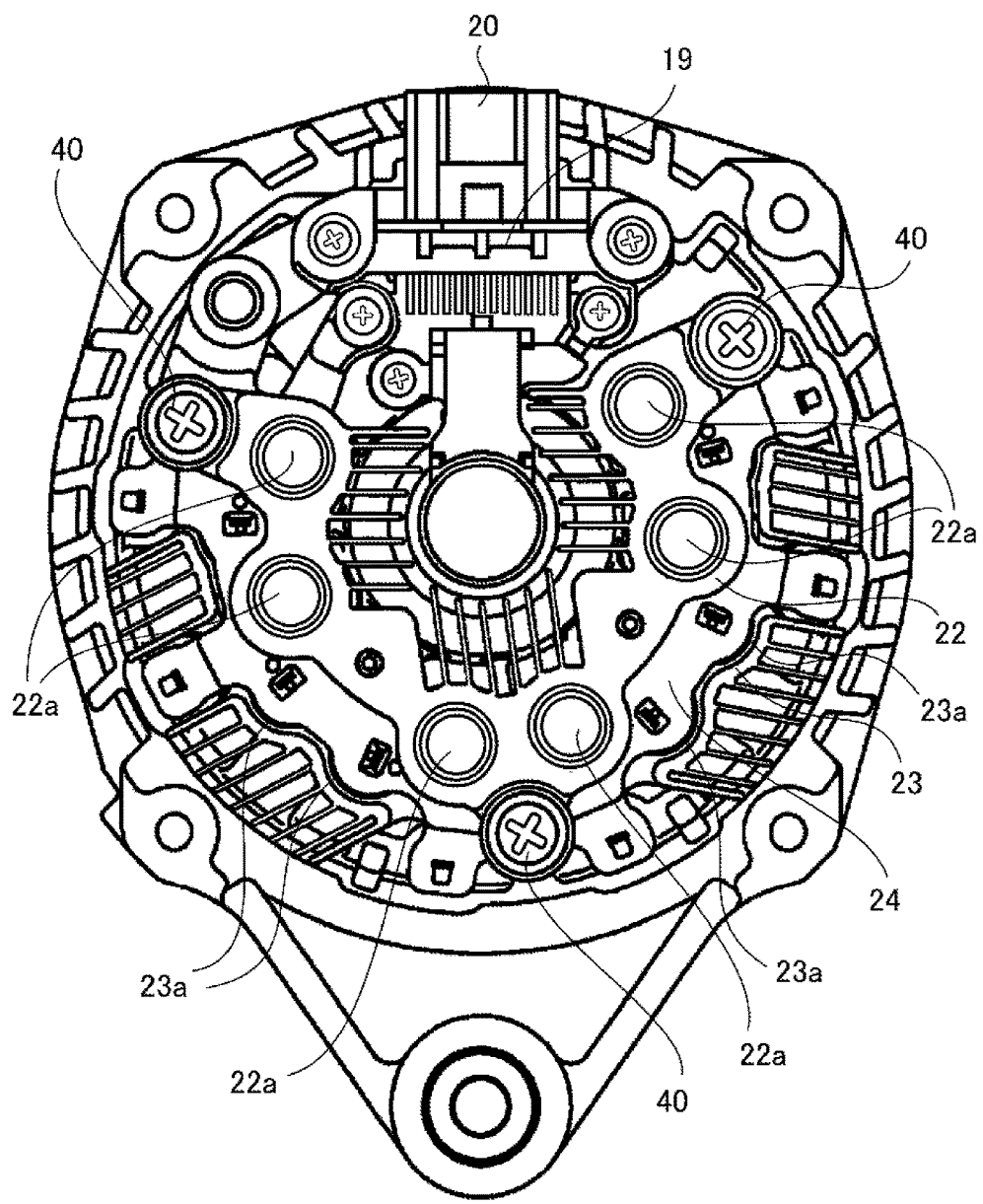
FIG. 2 is a rear view showing an attached state of the rectifier in the vehicle alternating current generator of FIG. 1 and shows a state where a protective cover is removed.
Figure 3:
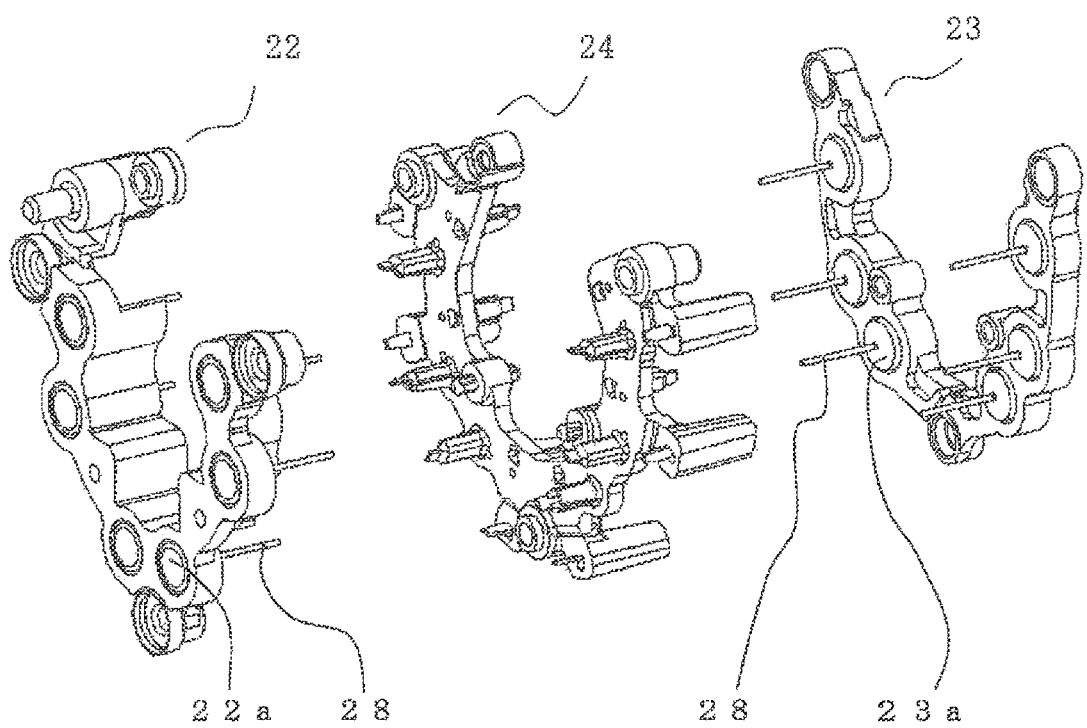
FIG. 3 is an exploded perspective view of the rectifier of FIG. 1 and shows, exclusive of fins.

FIG. 1 is a sectional view showing a vehicle alternating current generator to which a rectifier according to Embodiment 1 of the present invention is applied; and FIG. 2 is a rear view showing an attached state of the rectifier in the vehicle alternating current generator and shows a state where a protective cover is removed. FIG. 3 is an exploded perspective view of the rectifier of FIG. 1 and shows, exclusive of fins.

A vehicle alternating current generator 1 of FIG. 1 includes a casing 4 composed of an aluminum-made front bracket 2 and a rear bracket 3, each being substantially bowl-shaped. The vehicle alternating current generator 1 includes: a shaft 6 rotatably supported to a casing 4 thereof via a pair of bearings 5; a pulley 7 firmly fixed to an end portion of a shaft 6 that extends to the front side of the casing 4; a rotor 8 fixed to the shaft 6 and disposed in the casing 4; a fan 11 fixed to axial both end surfaces of the rotor 8; a stator 12 fixed to the casing 4 so as to surround the rotor 8; a pair of slip rings 15 which is fixed to an extending portion of the shaft 6 that extends to the rear side of the casing 4 and supplies an electric current to the rotor 8; a pair of brushes 16 which slides on the surface of each slip ring 15; and a brush holder 17 which contains these brushes 16.

Further, the vehicle alternating current generator 1 includes: a voltage regulator 19 which is attached to a heat sink 18 disposed on the outer diameter side of the brush holder 17 and adjusts the size of an alternating voltage generated by the stator 12; a connector 20 which inputs and outputs a signal to and from an external device such as a battery (not shown in the drawing); a rectifier 21 which is placed on the rear side of the rear bracket 3 and converts alternating current electromotive force generated by the stator 12 to direct current output voltage; and a protective cover 25 attached to the rear bracket 3 so as to cover the brush holder 17, the voltage regulator 19, and the rectifier 21.

The rotor 8 is a Lundell type rotor and includes: a field winding 9 through which an exciting current flows to generate magnetic flux; and a pole core 10 which is provided so as to cover the field winding 9 and forms magnetic poles by the magnetic flux. Furthermore, the stator 12 includes: a cylindrical stator core 13; and a stator winding 14 which is wound around the stator core 13 and induces the alternating current electromotive force by a change in the magnetic flux from the field winding 9 with the rotation of the rotor 8. The stator 12 is disposed so as to surround the rotor 8 with the stator core 13 being held in sandwiched relation from axial both ends on the opening ends of the front bracket 2 and the rear bracket 3.

The rectifier 21 (FIG. 2, FIG. 3) includes: a positive pole side heat sink 22 in which a plurality of positive pole side rectifying elements 22a are mounted, a negative pole side heat sink 23 in which a plurality of negative pole side rectifying elements 23a are mounted, and a circuit board 24; and the rectifier 21 is configured in a substantially "C" shape viewed in the axial direction by laminating the circuit board 24 while being sandwiched between the positive pole side heat sink 22 and the negative pole side heat sink 23. Then, the positive pole side rectifying element 22a and the negative pole side rectifying element 23a are connected so as to configure a predetermined bridge circuit via the circuit board 24. In this case, as shown in the exploded view of FIG. 3, in a state where leads 28 of the rectifying elements 22a, 23a are respectively extended long, the positive pole side heat sink 22, the circuit board 24, and the negative pole side heat sink 23 are laminated around the shaft 6 and electrical connection is made by welding, caulking, or the like at the respective tip end portions of the leads 28.

The thus configured rectifier 21 is arranged in a fan-like fashion with the shaft 6 being the center on the plane perpendicular to the axis of the shaft 6 on the outer peripheral side of the slip ring 15 and is attached by tightening and fixed to the outer end surface of the rear bracket 3 by screws 40. Then, lead wires 14a (FIG. 1) of the stator winding 14 are led out from the rear bracket 3 and are connected to terminals of the circuit board 24, so that the rectifier 21 and the stator winding 14 are electrically connected.

Figure 4:
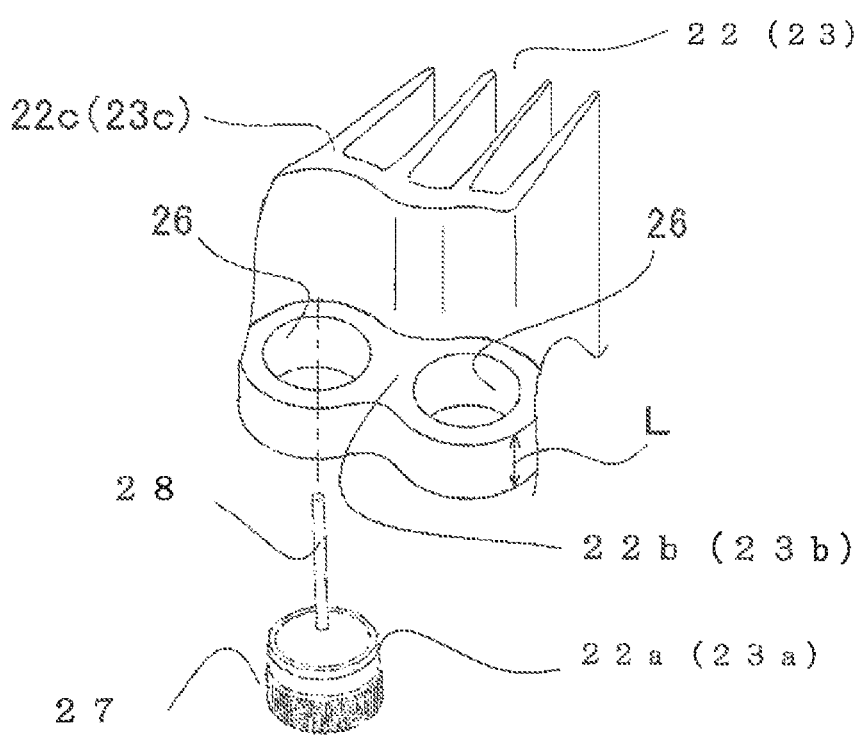
FIG. 4 is an exploded perspective view of a relevant part around a rectifying element of the rectifier of FIG. 1.

FIG. 4 is an exploded perspective view of a relevant part around the rectifying element of the rectifier of FIG. 1. As shown in FIG. 4, the heat dissipation heat sinks 22, 23 of the rectifier are each a casting-made component composed of a flat plate portion (flat plate-shaped portion) 22b(23b) to which each columnar heat sink 27 (to be described later) of the rectifying element 22a(23a) is press-fitted and a plurality of fins 22c(23c) integrally extending from the flat plate portion, as partly shown in the sectional view of FIG. 1. In the embodiment, the rectifying element 22a(23a) has the columnar heat sink 27 at one end portion and has the electrical lead (lead wire) at the other end portion; and a semiconductor pellet that converts alternating current to direct current is mounted in an outer peripheral edge portion.

Figure 5:
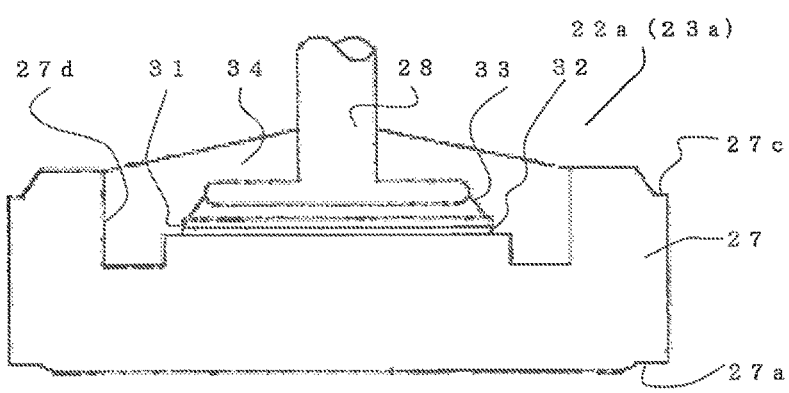
FIG. 5 is a sectional view in an example of the rectifying element applicable to Embodiment 1.

FIG. 5 is a sectional view in an example of the rectifying element applicable to Embodiment 1. The rectifying element includes various figures and an example thereof is shown. The columnar heat sink 27 has a knurl 27b (FIG. 8) on an outer peripheral portion; and an outer peripheral edge portion 27a of the bottom surface is formed in an annular flat surface. The annular flat surface of the outer peripheral edge portion 27a is a portion to be brought into contact with an annular receiving surface of a load receiving jig 101 (to be described later). An upper outer peripheral edge portion 27c is also formed in an annular flat surface. The columnar heat sink 27 is formed with a concave portion 27d on an upper half portion at a central portion that is apart from a vertical outer peripheral edge portion; and a semiconductor pellet 31 is mounted on the concave portion 27d. The semiconductor pellet 31 is fixed and connected to the bottom of the concave portion 27d of the columnar heat sink 27 by a solder layer 32 and is fixed and connected to the lead 28 by a solder layer 33. Reference numeral 34 denotes a protective layer made of resin or silicone gum and protects the semiconductor pellet 31.

In FIG. 4, the flat plate portion 22b(23b) includes an axial dimension L sufficient enough to retain the rectifying element 22a(23a) to be press-fitted and to serve for heat conduction to the columnar heat sink 27 of the rectifying element. The fins 22c(23c) are extended in plural number in the axial direction from at least one end surface of the flat plate portion 22b(23b). The fins 22c(23c) include a larger dimension than the axial dimension L, serve for heat dissipation, and are arranged in plural number at a predetermined pitch in a peripheral direction. The rectifying elements 22a(23a) are attached to a plurality of press-fit holes 26 formed in the flat plate portion 22b(23b), respectively, with the centers of the columnar heat sink 27, the lead 28, and the press-fit hole 26 being aligned. Cutting is not done on the press-fit hole 26, but is still a cast skin surface; and, basically, the flat plate portion 22b(23b) and the fins 22c(23c) are also made into a product in a shape obtained by a casting die.

Figure 6:
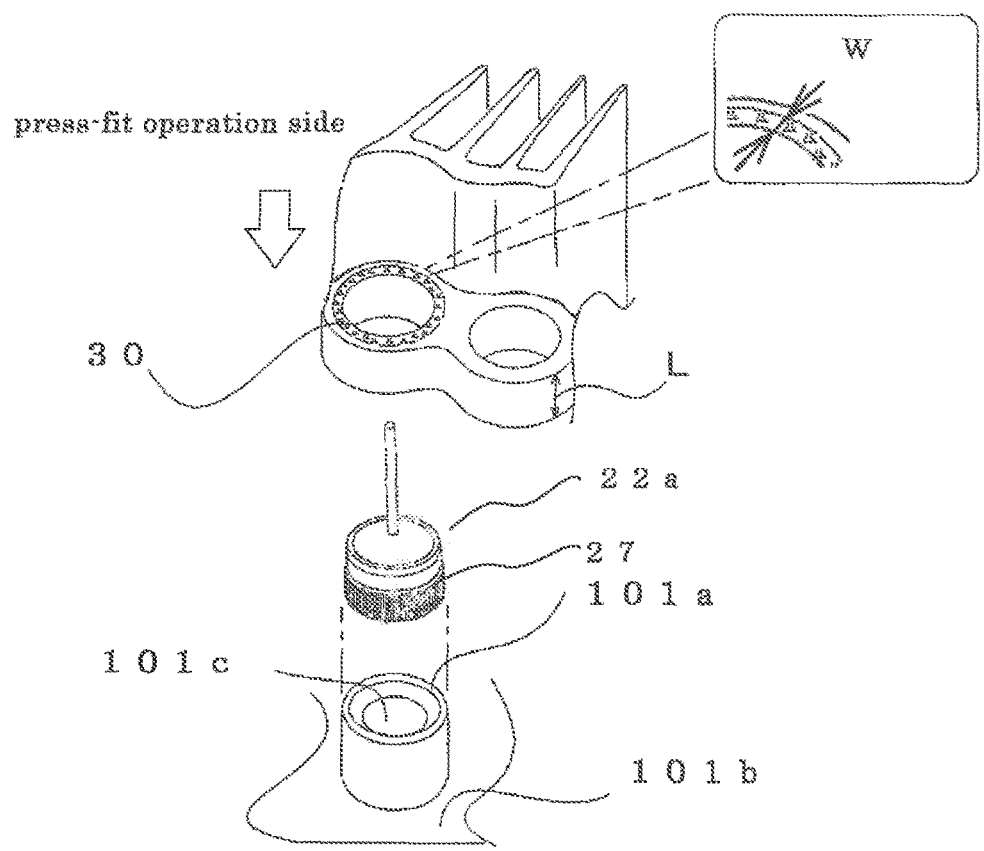
FIG. 6 is an assembly schematic view in the exploded perspective view of the relevant part of FIG. 4.

Next, assembly processes of the rectifying element 22a(23a) to the heat dissipation heat sink 22(23) will be described in detail. For convenience' sake, positive pole side assembly will be described; however, negative pole side assembly is also the same. FIG. 6 is an assembly schematic view in the exploded perspective view of the relevant part around the rectifying element shown in FIG. 4. FIG. 7(a), FIG. 7(b), FIG. 7(c), and FIG. 7(d) are each process sectional view showing assembly to the heat dissipation heat sink of the rectifying element in Embodiment 1.

As for the load to the rectifying element 22a, the outer peripheral edge portion 27a of the bottom surface of the columnar heat sink 27 is received by an annular receiving surface 101a of the load receiving jig 101 from the lower side, and the flat plate portion 22b is pressed downward by a press-fit jig from the non-facing surface side ("the press-fit operation side" of FIG. 6) of the press-fit hole 26 through which the lead 28 is passed through. A press-fit head 102a of the press-fit jig is a cylindrical body having, for example, a columnar hollow hole so as not to interfere with the lead 28. After the press-fit, a ring shaped press-fit mark 30 with a width W by the press-fit head is remained on the flat plate portion 22b on the press-fit operation side.

The assembly processes will be described in accordance with FIG. 7(a) to FIG. 7(d).

FIG. 7(a); In a state where the rectifying element 22a is retained by the through hole 103a of an insertion guide 103 with the columnar heat sink 27 (the outer peripheral edge portion 27a of FIG. 5) side being placed on the bottom side and the lead 28 of the rectifying element 22a is protruded from the press-fit hole 26, the rectifying element 22a is guided so as to align the axis of the rectifying element 22a with the axis of the press-fit hole 26 of the facing heat dissipation heat sink 22 and the flat plate portion 22b of the heat dissipation heat sink 22 is placed on the insertion guide 103. The load receiving jig 101 is placed on the lower side in face-to-face relation to the press-fit head 102a placed on the upper side by aligning the respective axes with the axis of the rectifying element 22a.

FIG. 7(b); The press-fit head 102a is made to move downward to sandwich the heat dissipation heat sink 22 between the press-fit head 102a and the insertion guide 103, and the heat dissipation heat sink 22 is fixed at a predetermined position on the insertion guide 103. At this time, the columnar hollow hole of the press-fit head 102a faces the press-fit hole 26 of the heat dissipation heat sink 22; and the lead 28 of the rectifying element 22a is protruded in the columnar hollow hole.

FIG. 7(c); The insertion guide 103, the flat plate portion 22b, and the press-fit head 102a, which are in a state where the rectifying element 22a is guided therein, are made to go down together; and the outer peripheral edge portion 27a of the bottom surface of the columnar heat sink 27 is made to face and come in contact with the annular receiving surface 101a of the load receiving jig 101.

FIG. 7(d); The flat plate portion 22b and the insertion guide 103 are pressed to load from the periphery of the press-fit hole 26 of the flat plate portion 22b by the annular surface of the lower end of the press-fit head 102a until the bottom surface of the insertion guide 103 comes in contact with an axial positioning surface 101b of a shoulder portion of the load receiving jig 101. At this time, a load applied to the outer peripheral edge portion 27a of bottom surface of the columnar heat sink 27 is received by the annular receiving surface 101a of the load receiving jig 101. By this, the rectifying element 22a is press-fitted into the press-fit hole 26. The insertion guide 103 suppress the inclination of the rectifying element 22a and oblique press-fit is avoided.

The used load receiving jig 101 is formed with a protrusion portion at one end portion and has the annular receiving surface 101a with the concave portion at the central portion at an end portion of the protrusion portion. The annular receiving surface 101a of the load receiving jig 101 is an annular flat surface. The annular receiving surface 101a having the annular flat surface receives the load applied to the outer peripheral edge portion 27a of the bottom surface of the columnar heat sink 27. The axial positioning surface 101b is formed on the shoulder portion of the protrusion portion having the annular receiving surface 101a; the distance between the annular receiving surface 101a and the axial positioning surface 101b is set to a desired value taking into account the axial length of the insertion guide and the axial length of the flat portions of the heat dissipation heat sink; and the rectifying element 22a is press-fitted into the press-fit hole 26 of the heat dissipation heat sink 22 to the defined depth by pressing until the bottom surface of the insertion guide 103 comes in contact with the axial positioning surface 101b.

Incidentally, in the aforementioned FIG. 7(a), the rectifying element 22a is retained by the through hole 103a of the insertion guide 103 with the columnar heat sink 27 (the outer peripheral edge portion 27a of FIG. 5) side being placed on the bottom side; however, the rectifying element 22a may be retained by the through hole 103a of the insertion guide 103 with the lead 28 being placed on the lower side and with the outer peripheral edge portion 27c (FIG. 5) side of the columnar heat sink 27 being placed on the bottom side. In this case, the load receiving jig 101 formed with the protrusion portion at one end portion is formed with a columnar hollow hole in an axial portion thereof; the lead 28 of the rectifying element 22a is made to protrude in the columnar hollow hole; and the load applied to the outer peripheral edge portion 27c of the columnar heat sink 27 is received by the annular receiving surface 101a of the load receiving jig 101.

By the aforementioned assembly processes, the rectifying element 22a press-fitted in the heat dissipation heat sink 22 can secure positional accuracy required for connection with an insert terminal (not shown in the drawing) of the circuit board 24. The end of the press-fit head 102a is the flat annular surface and the press-fit hole is not pressed by the taper shaped outer peripheral inclined surface from the upper side as in the centering pin shown in Patent Document 5; and thus, the press-fit hole is not inclined right and left and verticality of the press-fit hole can be secured. Furthermore, the heat dissipation heat sink 22 is sandwiched between the flat surfaces from top and bottom by the press-fit head 102a and the insertion guide 103 and is shifted to a press-fit process; and thus, even when a press-fit load reaches 10000 N (1000 kgf), the heat dissipation heat sink 22 is not likely to be deformed. In the engagement of the conventional centering pin, the upper surface of the member to be press-fitted is not surely pressed by the flat surface. Accordingly, there is a high possibility that the centering pin is dented into the hole and the member to be press-fitted is bent; and thus, reliability cannot be secured.

Furthermore, particularly, for example, the flat shaped insertion guide 103 (perpendicular to the axis) and the axial positioning surface 101b of the load receiving jig 101, which are in parallel to the flat plate portion 22b of the heat dissipation heat sink 22 that is formed in a flat surface perpendicular to the press-fit hole 26, are used for axial positioning; and thus, the end height (relative height) after assembling the lead 28 of the rectifying element 22a whose length is previously defined becomes stable, and a lead joint failure of subsequent electrical connection is suppressed. Control of press-fit depth is also easy.

The accuracy of the hole (cast skin surface) of the press-fit hole 26 used in the above-mention is lower than a case by cutting and is higher than a case by punching. More specifically, energy in the case of the cutting is not required and the hole with appropriate accuracy can be provided by the heat dissipation heat sink integrated with a large number of complicated fins.

Figure 8:
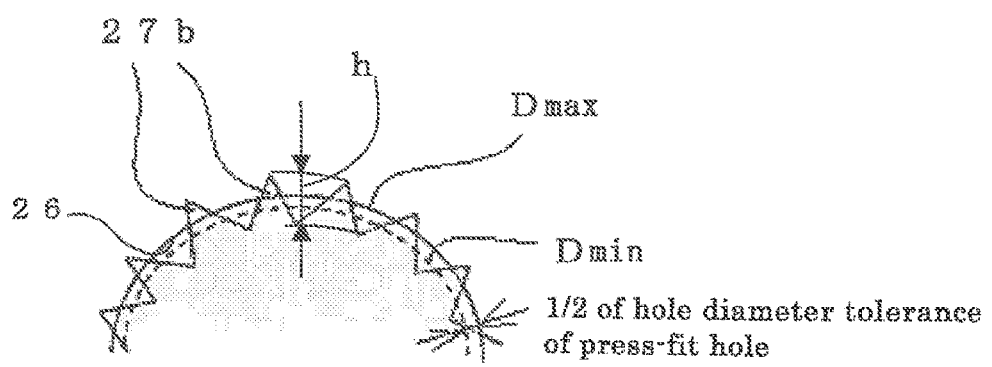
FIG. 8 is a schematic view for explaining the relation between a knurl of a columnar heat sink of the rectifying element and a press-fit hole of the heat dissipation heat sink in Embodiment 1, and is a schematic sectional view perpendicular to an axis.
Figure 9:
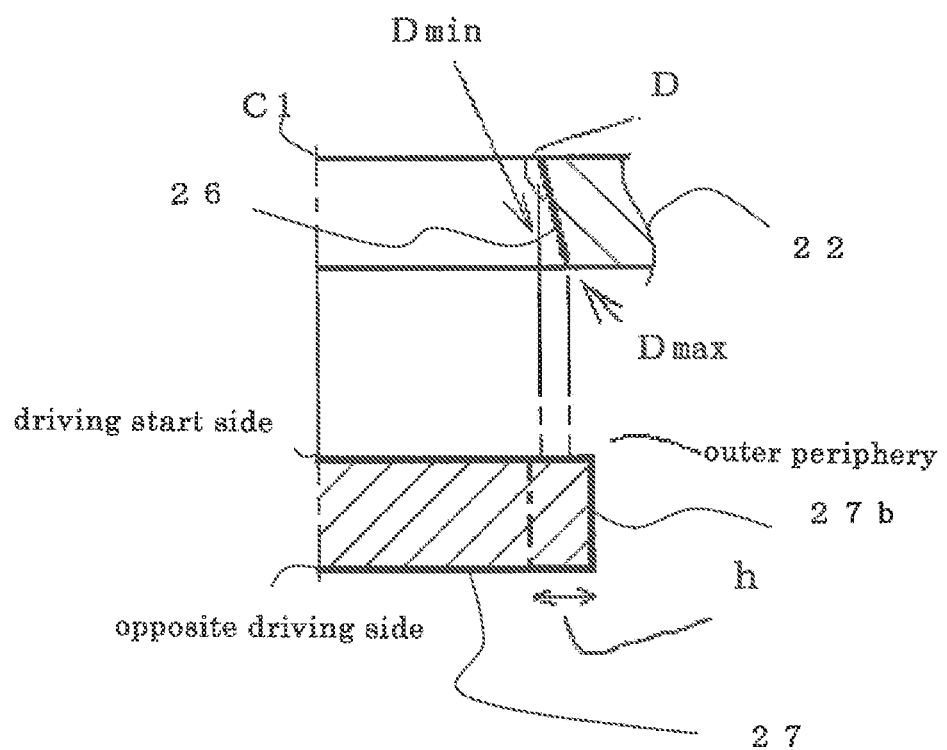
FIG. 9 is a schematic view for explaining the relation between the knurl of the columnar heat sink of the rectifying element and the press-fit hole of the heat dissipation heat sink in Embodiment 1, and is a sectional view parallel to the axis.

FIG. 8 is a schematic view for explaining the relation between the knurl 27b of the columnar heat sink 27 of the rectifying element 22a and the press-fit hole 26 of the heat dissipation heat sink 22 in Embodiment 1, and is a schematic sectional view perpendicular to the axis. FIG. 9 is a schematic view for explaining the relation between the knurl 27b of the columnar heat sink 27 of the rectifying element 22a and the press-fit hole 26 of the heat dissipation heat sink 22 in Embodiment 1, and is a sectional view parallel to the axis. C1 of FIG. 9 denotes the center axis of the press-fit hole 26; D denotes the inner diameter of the press-fit hole 26; and h denotes the height of the ridge from the valley of the knurl 27b of the columnar heat sink 27. As for the rectifying element 22a, the knurl 27b is formed on the outer peripheral portion of the columnar heat sink 27. A standard to be defined is configured to correspond from a minimum inner diameter dimension Dmin to a maximum inner diameter dimension Dmax of the inner diameter D including gradient and/or tolerance due to the casting die, in the press-fit hole 26 of the heat dissipation heat sink 22; and the height h of the ridge from the valley of the knurl 27b is set to equal to or more than ½ of a hole diameter tolerance (Dmax−Dmin) of the press-fit hole 26 of the heat dissipation heat sink 22. Thus, there is obtained a rectifier with high reliability, in which the columnar heat sink 27 can be stably press-fitted and retained to the press-fit hole 26 formed of the cast skin surface and a contact area can also be stably obtained. Further, the diameter dimension of the valley of the knurl 27b is smaller than the minimum inner diameter dimension Dmin of the press-fit hole 26 of the heat dissipation heat sink 22 (FIG. 9); and the diameter dimension of the ridge is larger than the maximum inner diameter dimension Dmax of the press-fit hole 26 of the heat dissipation heat sink 22. That is, the configuration is made such that the press-fit is accomplished by only deformation of the ridge of the knurl 27b.

An outer peripheral wall portion is not made to deform obliquely enough to deform the diode heat sink itself as in Patent Document 1, and an influence on the semiconductor pellet mounted on the rectifying element 22a is minimized. The taper configuration of Patent Document 2 and/or 3 is intended to eliminate a damage of the inner peripheral surface of the mounting hole, due to galling on the press-fit end and/or the press-fit start side; however, different from that, Embodiment 1 can achieve a reduction in splitting or cracking of the entire inner periphery of the press-fit hole 26 by reliably coming in contact with only the knurl ridge portion from the start of press-fit to the end thereof. Further, the knurl 27b itself is neither a large diameter nor a small diameter in the axial direction thereof; and thus, manufacture can be made by a normal manufacturing technique and dimensional designation may be only changed.

Figure 10:
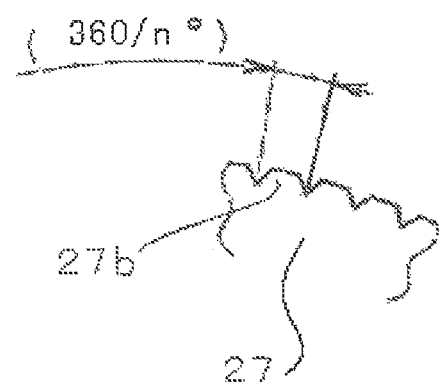
FIG. 10 is a schematic view showing the detail of the knur portion of the columnar heat sink in Embodiment 1.

Furthermore, the entire periphery of the outer peripheral edge portion 27a of the bottom surface of the columnar heat sink 27 is equally supported by the annular receiving surface 101a of the load receiving jig 101; and thus, the knurl 27b applied to the outer peripheral portion is also preferable to be uniformly arranged on the outer peripheral portion and there can be avoided a possibility that the knurl 27b is press-fitted into the press-fit hole 26 obliquely. Analysis results of distortion to the semiconductor pellet to be mounted on the rectifying element 22a also have very little distortion and are good. Incidentally, the knurl 27b shown in FIG. 8 is an outline and a detailed example is shown in FIG. 10. FIG. 10 is a schematic view showing the detail of the knurl 27b of the columnar heat sink 27 in Embodiment 1. Reference letter n denotes the number of knurl ridges. Preferably, the knurl ridge portion is formed in a circular arc. By this shape, both contact areas can also be stably obtained and variation and deterioration in heat dissipation efficiency can be reduced.

Furthermore, the height of the knurl is set to the aforementioned defined standard; and thus, it can also correspond to dimensional changes against environment on the press-fit hole 26 side. For example, in the case where a coefficient of linear expansion of aluminum of the heat dissipation heat sink 22 is $23.6 \times 10^{-6}$ mm/K and a change in temperature is 200 Kelvin, a deformation of $23.6 \times 10^{-6} \times 200 = 4.72$ μm is anticipated. In response, if the height of the knurl is not sufficiently high, retention force becomes unstable. In Embodiment 1, with respect to a deformation allowance mentioned before, the height of the knurl is set to a value equal to or more than twenty times as much as 4.72 µm (4.72 µm×20) and thus good result is obtained.

Figure 7:
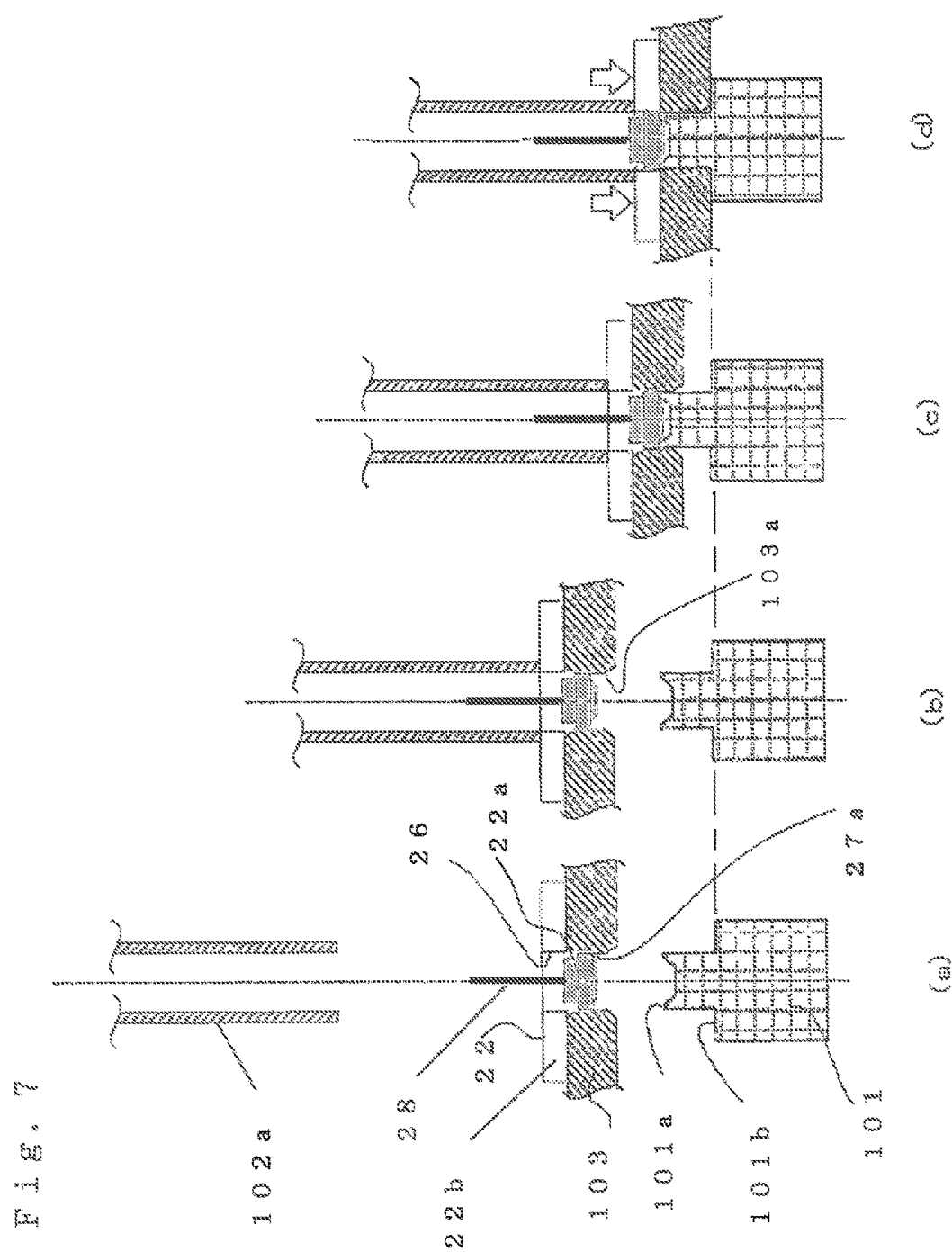
FIG. 7(a), FIG. 7(b), FIG. 7(c), and FIG. 7(d) are each process sectional view showing assembly to a heat dissipation heat sink of the rectifying element in Embodiment 1.

Quality control as a product, in which the columnar heat sink 27 that is accurately defined to the aforementioned standard is press-fitted into the press-fit hole 26 of the heat dissipation heat sink 22 formed with a draft angle due to the casting die, is performed by detecting a press-fit final load in the process of the aforementioned FIG. 7(*d*). More specifically, a situation where the insertion guide 103 comes in contact with the axial positioning surface 101*b* of the load receiving jig 101 is detected by a press-fit load at which the rectifying element 22*a* is press-fitted into the press-fit hole 26 of the heat dissipation heat sink 22. Furthermore, a load in the middle of press-fit is also monitored. In the axial direction, the distance between the annular receiving surface 101*a* of the load receiving jig 101 and the axial positioning surface 101*b* is set to a desired value which is taken into account the axial length of the insertion guide and the axial length of the flat plate portion of the heat dissipation heat sink; and thus, there is obtained the heat dissipation heat sink 22 in which the press-fit of the rectifying element is completed at a constant axial position by only the load control.

The knurl portion of the columnar heat sink 27 is set to the aforementioned defined standard and the load is controlled; and thus, a high-definition rectifier component can be obtained even if any further control than finish by the die and/or additional cutting is not performed on the press-fit hole 26 side of the heat dissipation heat sink 22. In the control by conventionally performed check of the press-fit hole diameter, when casting products are delicately different for each lot and/or according to manufacturing places, control is difficult. However, in Embodiment 1, the control is performed mainly by the press-fit load; and therefore, unified quality maintenance can be easily achieved. For example, as in the conventional press-fit device in Patent Document 5, if the spring is incorporated in the mechanism in which the pressing tool moves upward and downward (drawings of Patent Document 5), load control in the middle of the press-fit cannot be performed and accordingly other control method has to be examined in order to avoid a defective piece such as excessive press-fit and the like.

The protrusion portion of the load receiving jig 101 is the annular receiving surface 101*a* with the concave portion at the central portion thereof; and therefore, not only the load during the press-fit is not applied from a rear surface to a range on which the semiconductor pellet is mounted (the central portion excluding the outer peripheral edge portion which comes in contact with the annular receiving surface 101*a* of the columnar heat sink 27 of the rectifying element) and the load hardly affects the semiconductor pellet, but also "shavings" of the aluminum heat sink can be taken, the shavings being generated by scraping with each other to some degree during the press-fit. Therefore, also there is not generated a failure which is caused because the "shavings" is bitten in a manufacturing line. The annular upper surface of the annular receiving surface 101*a* is flat-shaped; and therefore, there does not cause non-uniform contact which is likely to be generated in coming in contact with the outer peripheral portion of the pressing surface in the case of the spherical concave type press-fit jig shown in Patent Document 1. Furthermore, if the range of the annular receiving surface 101*a* of the load receiving jig 101 is only the central portion or only the outer diameter portion, which is intended to prevent inclination, distortion will be surely applied to the columnar heat sink 27; and therefore, it is preferable to widely receive from the boundary of the outer diameter of the semiconductor pellet to the full side of the press-fit hole diameter. Therefore, in the load receiving jig 101, the outer diameter of the annular receiving surface 101*a* which presses the outer peripheral edge portion 27*a* of the columnar heat sink 27 of the rectifying element 22*a* is preferable to be substantially the same as the inner diameter of the through hole of the insertion guide 103.

Furthermore, a cutting process of the inner periphery of the press-fit hole 26 is not needed; and as for cutting waste liquid that cannot be directly discarded, necessary energy for treatment can be saved. Electric power needed for recycle of a portion punched by a punching die is not consumed and it becomes friendly to global environment.

One example of the insertion guide 103 has been described in the before-mention, but not limited to this; for example, there can be appropriately selected a type which is separately composed of the upper half as a tubular component portion for the purpose of preventing inclination and the lower half as a support component portion that supports the outer peripheral edge portion 27*a* of the bottom surface of the columnar heat sink 27. Similarly, a configuration around the press-fit head 102*a* is not also limited to the cylindrical shape as shown in the drawings; for example, there can be used one which includes a centering mechanism which performs center alignment of the rectifying element in a cylinder inside and improves assembly accuracy. If the end surface of the press-fit head 102*a* is formed in an annular shape, the shape of other portion is not limited.

Incidentally, the present invention can appropriately change or omit the embodiments within the scope of the present invention.

The invention claimed is:

1. A method for manufacturing a rectifier in which a rectifying element, which has a columnar heat sink and is equipped with a semiconductor pellet that converts alternating current to direct current, is press-fitted into a press-fit hole of a heat dissipation heat sink by aligning the axis of said rectifying element with the axis of the press-fit hole, the method including:
   said heat dissipation heat sink which has the press-fit hole whose inner peripheral surface is a cast skin surface;
   a press-fit head which applies a load to said heat dissipation heat sink;
   an insertion guide which has a through hole (103*a*), retains said rectifying element by the through hole, and guides said rectifying element so as to align the axis of said rectifying element with the axis of the press-fit hole of said facing heat dissipation heat sink; and
   a load receiving jig which is formed with a protrusion portion at one end portion thereof,
   the method comprising the steps of:
   sandwiching said heat dissipation heat sink by said press-fit head and said insertion guide by aligning the axis of said rectifying element in said insertion guide with the axis of the press-fit hole of said heat dissipation heat sink and making said press-fit head face said heat dissipation heat sink;
   making the protrusion portion of said load receiving jig face said columnar heat sink of said rectifying element in the through hole of said insertion guide; and
   press-fitting said rectifying element into the press-fit hole of said heat dissipation heat sink by pressing the periphery of the press-fit hole of said heat dissipation heat sink by said press-fit head and receiving a load applied to said columnar heat sink of said rectifying element by the protrusion portion of said load receiving jig.

2. The method for manufacturing the rectifier according to claim 1,
wherein said load receiving jig has an annular receiving surface with a concave portion at a central portion at an end portion of the protrusion portion thereof and receives a load applied to an outer peripheral edge portion of said columnar heat sink of said rectifying element by the annular receiving surface.

3. The method for manufacturing the rectifier according to claim 2,
wherein the annular receiving surface of said load receiving jig is an annular flat surface.

4. The method for manufacturing the rectifier according to claim 2,
wherein said load receiving jig has an axial positioning surface, and the distance between the annular receiving surface and the axial positioning surface is set to be a desired value; and
the periphery of the press-fit hole of said heat dissipation heat sink is pressed by said press-fit head, the load applied to the outer peripheral edge portion of said columnar heat sink of said rectifying element is received by the annular receiving surface of said load receiving jig, said insertion guide is pressed until coming in contact with the axial positioning surface of said load receiving jig, and said rectifying element is press-fitted into the press-fit hole of said heat dissipation heat sink.

5. The method for manufacturing the rectifier according to claim 4,
wherein said rectifying element has a protruding lead at one end portion thereof;
said press-fit head has a columnar hollow hole, the columnar hollow hole of said press-fit head is made to face the press-fit hole of said heat dissipation heat sink, said lead of said rectifying element is made to protrude in the columnar hollow hole, and a load is applied to said heat dissipation heat sink; and
the periphery of the press-fit hole of said heat dissipation heat sink is pressed by said press-fit head, the load applied to the outer peripheral edge portion of said columnar heat sink of said rectifying element is received by the annular receiving surface of said load receiving jig, and said rectifying element is press-fitted into the press-fit hole of said heat dissipation heat sink.

6. The method for manufacturing the rectifier according to claim 4,
wherein a situation where said insertion guide comes in contact with the axial positioning surface of said load receiving jig is detected by a press-fit load at which said rectifying element is press-fitted into the press-fit hole of said heat dissipation heat sink.

7. The method for manufacturing the rectifier according to claim 2,
wherein said rectifying element has a protruding lead at one end portion thereof;
said press-fit head has a columnar hollow hole, the columnar hollow hole of said press-fit head is made to face the press-fit hole of said heat dissipation heat sink, said lead of said rectifying element is made to protrude in the columnar hollow hole, and a load is applied to said heat dissipation heat sink; and
the periphery of the press-fit hole of said heat dissipation heat sink is pressed by said press-fit head, the load applied to the outer peripheral edge portion of said columnar heat sink of said rectifying element is received by the annular receiving surface of said load receiving jig, and said rectifying element is press-fitted into the press-fit hole of said heat dissipation heat sink.

8. The method for manufacturing the rectifier according to claim 2,
wherein, in said load receiving jig, the outer diameter of the annular receiving surface which receives the load applied to the outer peripheral edge portion of said columnar heat sink of said rectifying element is substantially the same as the inner diameter of the through hole of said insertion guide.

9. The method for manufacturing the rectifier according to claim 2,
wherein, in said rectifying element, a knurl is formed on an outer peripheral portion of said columnar heat sink, the height of the ridge from the valley of the knurl is equal to or more than ½ of a hole diameter tolerance of the press-fit hole of said heat dissipation heat sink; and
the minimum outer diameter of the valley portion of the knurl is smaller than the minimum inner diameter of the press-fit hole of said heat dissipation heat sink, and the maximum outer diameter of the ridge portion of the knurl is larger than the maximum inner diameter of the press-fit hole of said heat dissipation heat sink.

10. The method for manufacturing the rectifier according to claim 1,
wherein, in said rectifying element, a knurl is formed on an outer peripheral portion of said columnar heat sink, the height of the ridge from the valley of the knurl is equal to or more than ½ of a hole diameter tolerance of the press-fit hole of said heat dissipation heat sink; and
the minimum outer diameter of the valley portion of the knurl is smaller than the minimum inner diameter of the press-fit hole of said heat dissipation heat sink, and the maximum outer diameter of the ridge portion of the knurl is larger than the maximum inner diameter of the press-fit hole of said heat dissipation heat sink.

* * * * *